(12) United States Patent
Barth et al.

(10) Patent No.: US 6,559,042 B2
(45) Date of Patent: May 6, 2003

(54) PROCESS FOR FORMING FUSIBLE LINKS

(75) Inventors: Hans-Joachim Barth, Munich (DE); Lloyd G. Burrell, Poughkeepsie, NY (US); Gerald R. Friese, München (DE); Michael Stetter, München (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/894,337

(22) Filed: Jun. 28, 2001

(65) Prior Publication Data

US 2003/0003703 A1 Jan. 2, 2003

(51) Int. Cl.⁷ ................ H01L 21/3205; H01L 21/82; H01L 21/44; H01L 21/331; H01L 21/326
(52) U.S. Cl. .................. 438/601; 438/132; 438/612; 438/333; 438/467
(58) Field of Search ................ 438/132, 601, 438/612, 467, 661, 333, 281, 131

(56) References Cited

U.S. PATENT DOCUMENTS

| | | | |
|---|---|---|---|
| 4,455,194 A | * 6/1984 | Yabu et al. ............. 257/209 |
| 5,760,674 A | 6/1998 | Gilmour et al. ......... 337/297 |
| 5,872,390 A | * 2/1999 | Lee et al. ............... 257/529 |
| 6,033,939 A | 3/2000 | Agarwala et al. ....... 438/132 |
| 6,074,940 A | * 6/2000 | Lee et al. ............ 148/DIG. 55 |
| 6,160,302 A | 12/2000 | Palagonia ............... 257/529 |
| 6,162,686 A | * 12/2000 | Huang et al. ............ 257/503 |
| 6,180,503 B1 | 1/2001 | Tzeng et al. ............ 438/601 |
| 6,277,737 B1 | * 8/2001 | Sandhu et al. .......... 438/653 |
| 6,348,398 B1 | * 2/2002 | Wang ...................... 438/132 |
| 6,392,300 B1 | * 5/2002 | Koike ...................... 257/734 |
| 6,451,681 B1 | * 9/2002 | Greer ...................... 438/601 |
| 2002/0064969 A1 | * 5/2002 | Havemann ............... 438/783 |

* cited by examiner

Primary Examiner—Amir Zarabian
Assistant Examiner—Judith A. Cothorn
(74) Attorney, Agent, or Firm—Ira Blecker; Cantor Colburn LLP

(57) ABSTRACT

A process for forming fusible links in an integrated circuit includes forming the fusible link in the last metallization layer. The process can be employed in the fabrication of integrated circuits employing copper metallization and low k dielectric materials. The fusible link is formed in the last metallization layer and may be formed simultaneously with the bonding pad areas.

5 Claims, 5 Drawing Sheets

PROCESS FOR FORMING FUSIBLE LINKS

BACKGROUND OF THE INVENTION

The present invention relates to the fabrication of integrated circuits and more particularly, to the fabrication of an integrated circuit employing fusible links.

Integrated circuits are now transitioning from aluminum to copper metal interconnects as device generation goes beyond the 0.25 µm design rules. Aluminum metal is limited for these design rules due to its inability to reliably carry current in smaller sized circuit lines. Copper has lower resistivity than aluminum so it can carry more current in smaller areas, thus enabling faster and denser chips with increased computing power. Along with the transition from aluminum to copper is the improvement upon the dielectric insulating layers. Silicon dioxide has been traditionally used as the primary material for insulators and has a dielectric constant of about 3.9. New insulating materials such as low k dielectrics have been proposed, which lower interconnect capacitance and crosstalk noise to enhance circuit performance. These low k dielectrics typically comprise polymers and have dielectric constants less than about 3.0 Some examples of low k dielectrics include polyimide, fluorocarbons, parylene, hydrogen silsequioxanes, benzocyclobutenes and the like.

Fabrication of integrated circuits using copper and low k dielectrics present new challenges and problems for the semiconductor manufacturer. One change that has resulted is the implementation of a Damascene process to integrate copper into the circuit. Using the Damascene process, openings defining the wiring patterns are provided in the dielectric layer, extending from one surface of the dielectric layer to the other surface of the dielectric layer. These wiring patterns are then filled with a metallization metal using a filling technique such as electroplating, electroless plating, chemical vapor deposition, physical vapor deposition or a combination of methods. This process may include planarization of the metal on the surface of the dielectric removing excess metallization with a method such as chemical mechanical polishing.

The Damascene process uses most of the traditional structure but differs in the way the structure is built. Instead of etching as pattern in a metal film and surrounding it with dielectric material, a damascene process etches a pattern in a dielectric film, then fills the pattern with copper. An advantage of the Damascene process is that the metal etch is replaced with a simpler dielectric etch as the critical step that defines the width and spacing of the interconnect lines. In a single Damascene process, vias or openings are additionally provided in the dielectric layer and filled with metallization to provide electrical contact between layers of wiring levels. In the dual Damascene process, the via openings and the wiring pattern openings are both provided in the dielectric layer before filling with metallization.

Integrated circuits include a large number of semiconductor devices typically fabricated on a silicon substrate. To achieve the desired functionality, a plurality of conductors are usually provided to electrically couple selected devices together. In some integrated circuits, conductive links are coupled to fuses, which may be cut or blown after fabrication. The links are typically cut or blown using lasers or by an electrical pulse. In a dynamic random access memory (DRAM) circuit, fusible links may be used to replace failing or defective memory array elements with redundant array elements. To this end, additional segments of memory arrays are provided on the integrated circuit as replacements for the defective or failing segments. In logic circuits, fuses may be used to select or modify circuit performance or functions. Fusible links comprise metal lines that can be explosively fused open by application of laser energy or an electrical pulse which causes a portion of the link material to vaporize and a portion to melt. Typically, the fusible link is thin and composed of aluminum or polysilicon. However, the integration of copper and low k materials presents new problems for the manufacturer of integrated circuits employing fusible links.

Fusible links are generally formed as part of one of the metallization layers during fabrication of the integrated circuit. Typically a lower level, such as polysilicon, is used. This level would for example, contain the wordlines of a DRAM array. Prior to causing the link to open by application of laser energy, the interlevel dielectric layers above the fusible link are sometimes removed entirely and replaced by a thinner protective layer. The removed portions of insulating layer provide a short uniform path for the laser and confine the resultant debris. In other cases, the thick dielectric layers are etched down to a predetermined thickness above the link. The laser energy required to blow the fuse is proportional to the thickness of the dielectric material above the fuse.

The laser access window is commonly opened in a final etch step after the uppermost metallization level has been patterned and a final passivation layer has been deposited. The passivation layer is patterned to form access openings to bonding pads in the uppermost metallization level and, simultaneously form access openings to the fuses. At the bonding pads, the etch must penetrate the passivation layer and an antireflective coating (ARC) on the pad. However, the fuse openings must pass through not only the passivation layer, but the additional thickness of subjacent insulative layers. Even though etch rate selectivities favorable for etching insulative material over metallization are used, it is difficult to etch the entire fuse opening simultaneously with the bonding pad openings without either degrading the bonding pad by over-etching or leaving too much or too little or no insulator over the fuses. In current technology, the ARC over the bonding pads must also be removed by the passivation layer patterning step. This requires significant over-etching of the bonding pad and often results in excessive or total removal of insulative layer over the fuses. The total removal of the insulative layer is especially problematic since it exposes the fuses to atmospheric moisture and corrosion. As a result, the fuses are subject to oxidation and corrosion.

The integration of copper and low k dielectrics further complicates formation of fusible links. Some of the low k dielectrics have a relatively high oxygen diffusivity constant compared to traditional dielectrics, such as silicon dioxide. The build-up of copper oxide is detrimental to device performance. Higher contact resistance results from oxidation and corrosion, which impedes the flow of current through the integrated circuit. Thus, it is important to design a process that minimizes and/or eliminates oxidation of the copper. The process must also take into consideration that the choice of low k dielectric material will impact oxidation of the copper due to its oxygen diffusivity. Thus the process should minimize and/or eliminate exposure of the low k dielectric to the atmosphere.

Therefore, there is a need for an improved fusible link design and fabrication process that can be integrated with the newer materials being used in semiconductor manufacturing.

SUMMARY OF THE INVENTION

A process for forming a fusible link in an integrated circuit. The process includes forming a second dielectric layer on a planarized surface of an underlying metal interconnect and first dielectric layer. An oxide layer is deposited onto the second dielectric layer at a thickness effective to prevent cracking of the oxide layer during a laser fuse process. The oxide layer is patterned to form a via extending through the second dielectric layer to the underlying metal interconnect. The via is filled with a conductive metal. A final metal layer is deposited onto the substrate and patterned to form a fusible link, a bonding pad area and a desired wiring pattern. A passivation layer is deposited and patterned to simultaneously open the bonding pad area and a portion of the fusible link. Preferably, the process is utilized with integrated circuit fabrication employing low k dielectric and copper metal layers.

Other features and advantages of the present invention will be appreciated and understood by those skilled in the art from the following detailed description and drawings.

BRIEF DESCRIPTION OF THE DRAWINGS

Referring now to the drawings, which are meant to be exemplary and not limiting, and wherein like elements are numbered alike in the several Figures.

DETAILED DESCRIPTION OF THE PREFERRED EMBODIMENTS

A process for fabricating fusible links in an integrated circuit includes forming the fusible link in the last metallization layer. The process and resulting structure permits the integration of copper and low k dielectrics into the design of the integrated circuit. As a result, the copper regions are protected from the deleterious effects caused by the exposure to the atmosphere. The fusible links are preferably patterned and formed over the copper and low k dielectric layers. Advantageously, the process and structure result in a more robust and simpler process flow. Corrosion and oxidation of the underlying copper metal regions is minimized and/or eliminated thus maximizing performance enhancement from the use of these materials. In addition to the formation of the fusible links in the last metallization layer, the same layer can be used for forming the wire bond pads and the desired wiring patterns.

The low k dielectric layers are defined as those materials suitable for use in the manufacture of integrated circuits or the like having a dielectric constant less than about 3.0. Low k dielectrics can be generally categorized as one of three types: organic, porous, or doped oxides. Examples of organic low k dielectric materials suitable for use in the present invention include polyimides, benzocyclobutene, parylenes, and fluorocarbons. Examples of porous low k dielectric materials include nanoglass and aerogels. Examples of doped oxide low k dielectric materials include hydrogen silsequioxanes, nanoporous oxides and carbon doped silicon dioxides. Other low k dielectric materials will be apparent to one of ordinary skill in the art in view of this disclosure.

Figure 1A:
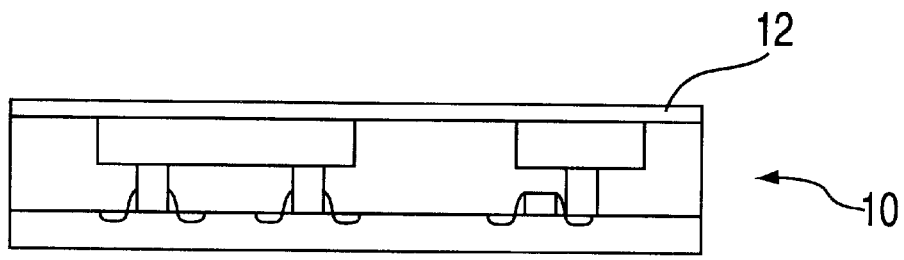
FIGS. 1A–O are cross-sectional views of an integrated circuit employing a fusible link.
Figure 1B:
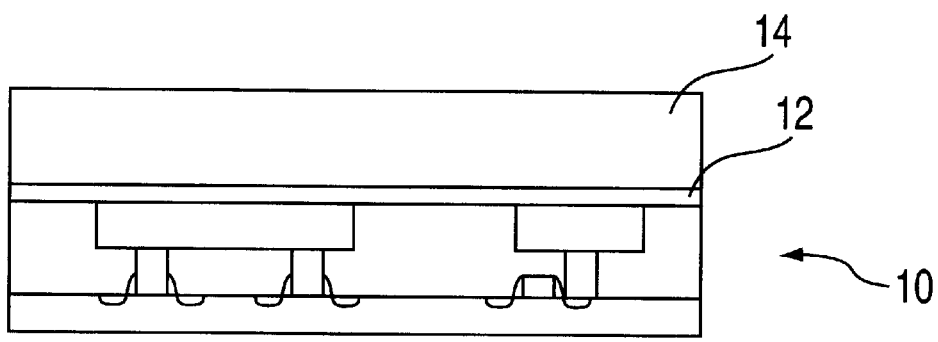
Figure 1C:
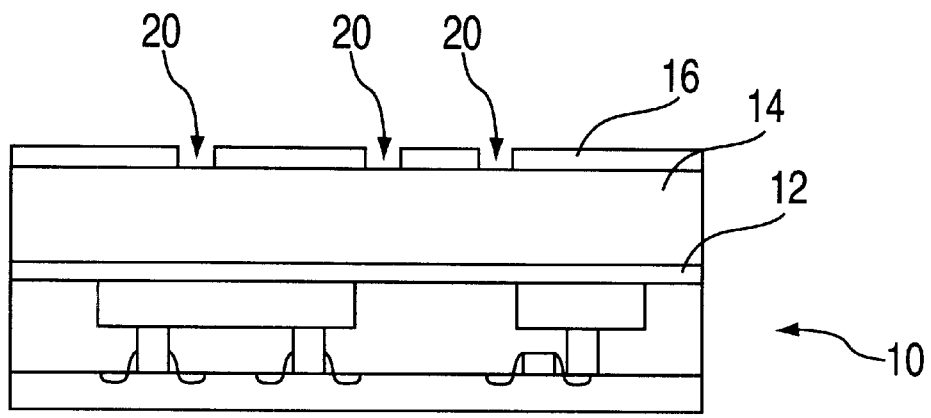
Figure 1D:
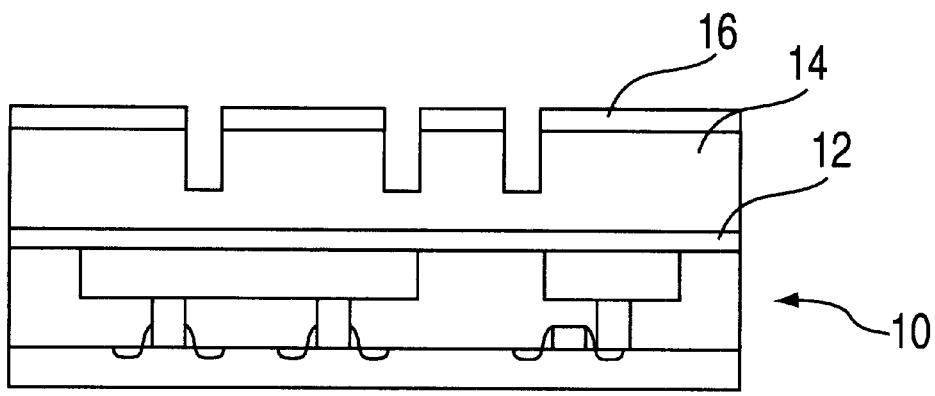
Figure 1E:
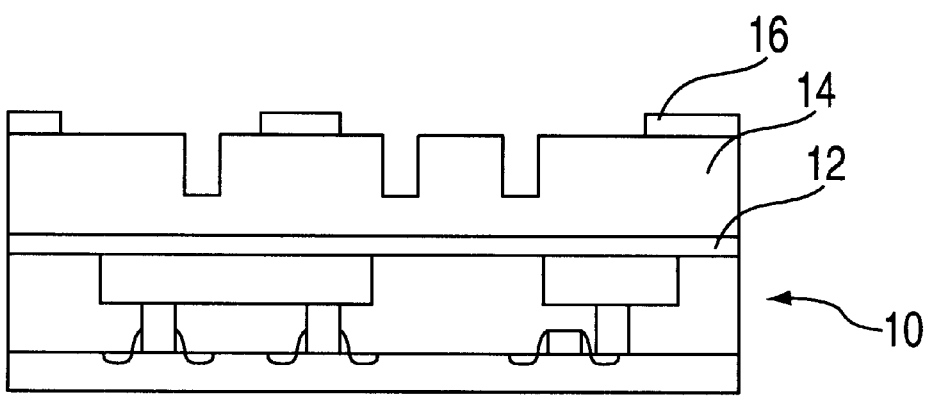
Figure 1F:
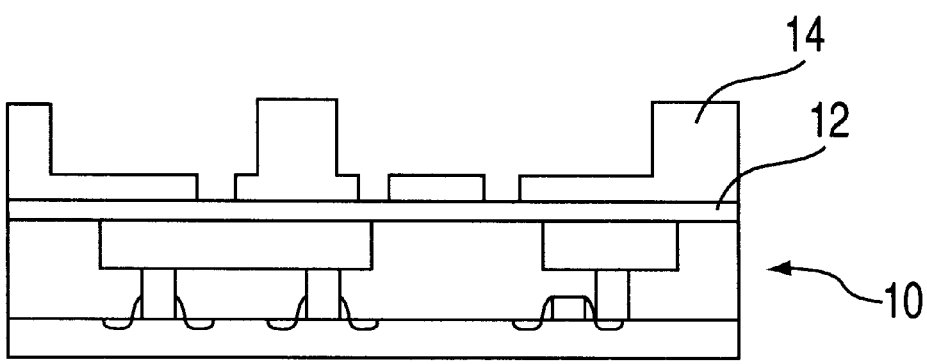
Figure 1G:
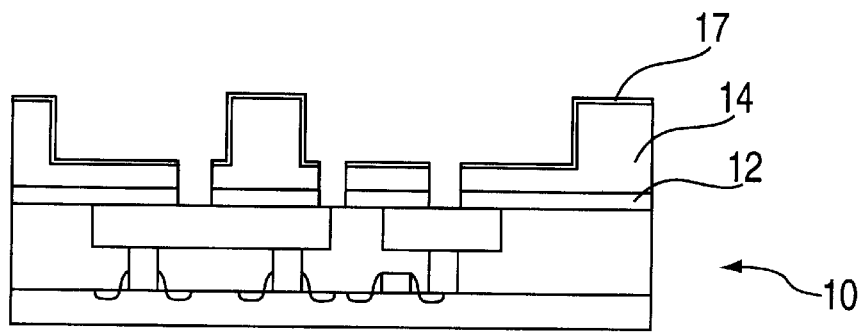
Figure 1H:
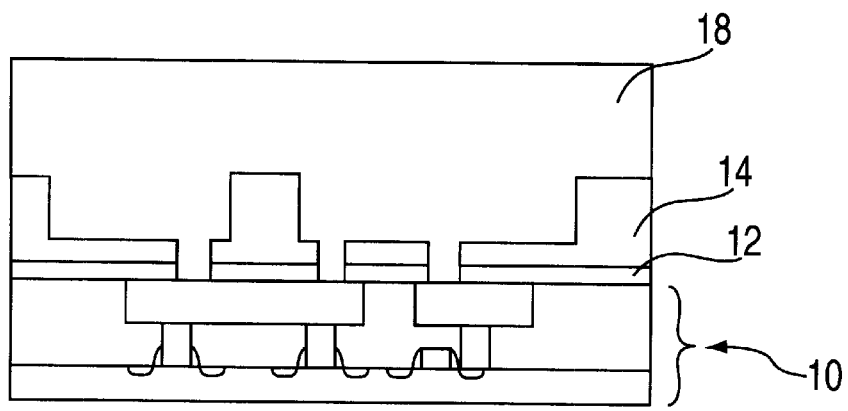
Figure 1I:
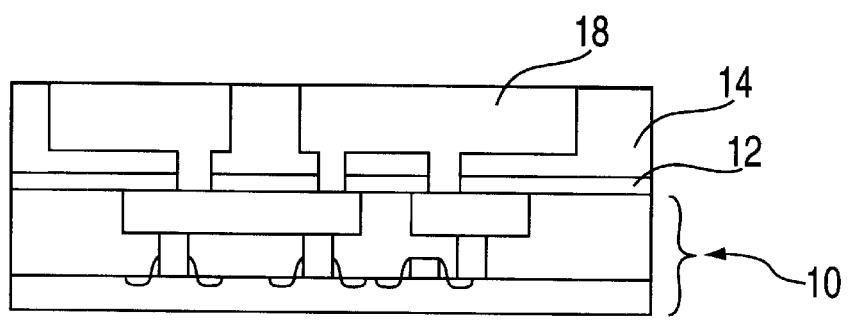
Figure 1J:
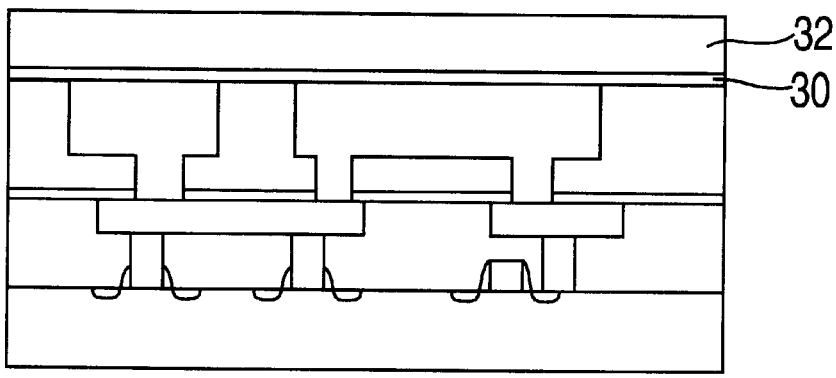
Figure 1K:
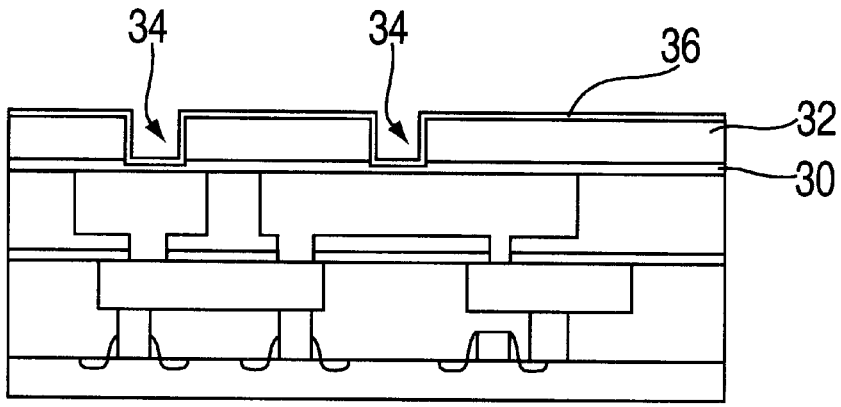
Figure 1L:
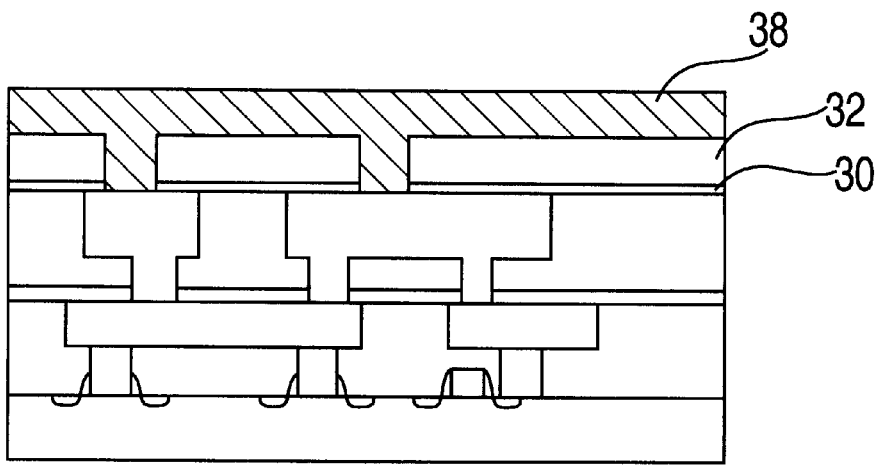
Figure 1M:
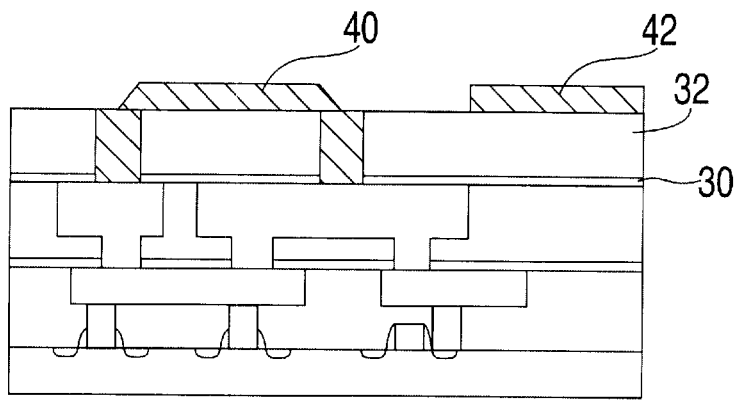
Figure 1N:
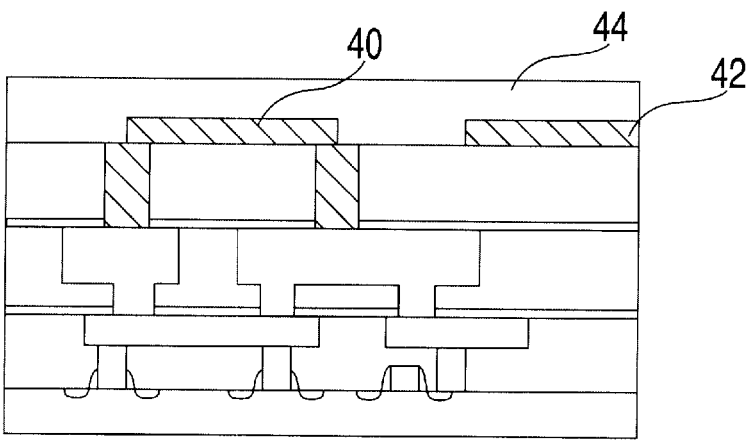
Figure 1O:
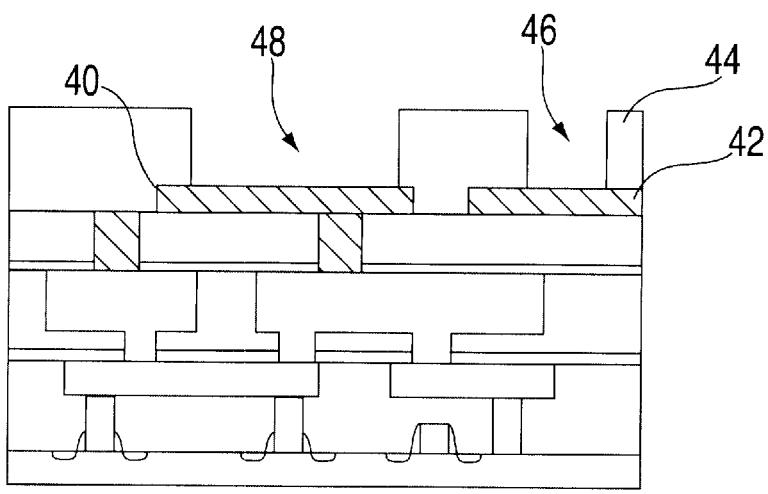

Turning now to FIGS. 1A–O, there is shown a dual Damascene process flow commonly used for the manufacture of integrated circuits having copper interconnects and low k dielectric layers. The illustrated Damascene process flow is exemplary only. It should be understood that a variety of processes can be used to integrate copper and low k dielectrics into the integrated circuit and the process shown is not intended to be limiting. Other integration processes suitable for use in the present invention will be apparent to those skilled in the art in view of this disclosure.

The Damascene process is shown occurring on an underlying metal layer generally designated 10 having a completed metal interconnect and dielectric layer. The metal layer is formed from a conductive material such as aluminum, copper, tungsten, an aluminum alloy, a tungsten alloy or a copper alloy. Preferably, the metal interconnect is copper and the dielectric layer is a low k material. Preferably, the low k dielectric layer is a polymeric dielectric known under the trade mark SILK (dielectric constant k=2.65), and commercially available by the Dow Chemical Company. The circuit design for this embodiment comprises a logic, SRAM or DRAM array having one or more redundant segments in a region adjacent to the primary memory array. Elements of the logic, SRAM or DRAM integrated circuit are concurrently formed elsewhere on the wafer. The first step in the fabrication of each copper interconnect level is deposition of a thin dielectric cap layer of silicon nitride or silicon carbide 12 as shown in FIG. 1A. For example, a thin dielectric cap layer suitable for use in the present invention is commercially available from Applied Materials under the the trade name BLOK. The dielectric cap layer acts as a barrier against diffusion of copper between metal levels and also serves as an etch stop in a dielectric etch process. In FIG. 1B, deposition of a thick low k dielectric layer 14 immediately follows deposition of the cap and etch stop layer. The low k material may have a thin layer of oxide on an upper surface. The dielectric layer is patterned by conventional photolithographic techniques using a photoresist as a masking material to form the vias 20 as shown in FIG. 1C. The photoresist 16 is coated onto the low k dielectric layer 14, patterned by exposure to activating energy, and subsequently developed to form a relief image. In FIG. 1D, the relief image is then partially etched into the dielectric layer using conventional etching techniques known to those skilled in the art. The photolithographic process is repeated to form a trench layer and subsequently etched as shown in FIGS. 1E–F.

As shown in FIGS. 1G–I, a copper metal deposition process is used to fill the spaces left by the etching and stripping process to form an additional metal layer. Current copper deposition processes may require deposition of a seed layer 17 for subsequent copper deposition as shown in FIG. 1G. After the copper 18 has been deposited, the wafer surface is then planarized typically by a chemical and mechanical polishing process. The processes may be repeated and the integrated circuit or the like is formed.

As shown in FIG. 1J, a dielectric capping layer 30 is formed over the planarized surface. Preferably, the dielectric capping layer is formed from silicon nitride or silicon carbide, e.g., BLOK. An oxide layer 32 is then deposited. The oxide layer should be thick enough to withstand the laser fuse process without cracking and exposing the underlying low k dielectric layer. Cracking of the oxide layer is deleterious since the formation of cracks exposes the underlying low k dielectric layer to the atmosphere. This can be problematic because low k dielectric layers have a relatively high oxygen diffusivity constant compared to the use of more traditional materials such as silicon dioxide. Cracking permits exposure of the atmosphere to the low k dielectric which subsequently can cause oxidation and/or corrosion of the embedded underlying copper metal regions.

Vias 34 are formed in the oxide and dielectric layer using conventional photolithography. The vias are preferably lined with a thin diffusion barrier 36 as shown in FIG. 1K. The diffusion barrier is deposited such as by sputtering. The diffusion barrier prevents inter-diffusion between the copper metal regions and subsequent metal layers, i.e., aluminum. Additionally, the barrier layer provides an underlayer for the aluminum layer. Suitable materials for the barrier layer include titanium, titanium nitride, tantalum, tantalum nitride, tungsten and tungsten nitride. Other barrier materials will be apparent to those skilled in the art in view of this disclosure.

As shown in FIGS. 1L–N, the vias are metallized and filled. Preferably, the vias are filled with aluminum or an aluminum alloy. Other conductive materials may be used to fill the vias, for example, copper, tungsten, a tungsten alloy or a copper alloy. Aluminum is then used to form the last metal layer 38 in the integrated circuit. It should be noted that a single metallization process could be employed if the conductive material used to fill the vias is the same as the material used for the final metal layer. Although reference is given to aluminum metal, other metals can be used and will be apparent to those skilled in the art. Preferably, aluminum is used to fill both the vias and form the final metal layer. The aluminum layer is then patterned to form the fusible link 40 as well as define the bonding pad areas 42, and the desired wiring for the circuit design or the like. A passivation layer 44 is then deposited at a thickness from about 1 micron to several microns. As is recognized in the art, the passivation layer is added at the end of the fabrication process to prevent deterioration of electronic properties through chemical action, corrosion or handling during the packaging processes. The passivation layer, usually silicon dioxide or silicon nitride, protects the underlying circuitry against moisture or contamination. The passivation layer is then patterned by well known photolithographic techniques and plasma etching or reactive ion etching (RIE) methods, using etchant gases or the like to deepen the opening through the passivation layer and to create an opening 46 to the bonding pad area 42 and fuse area opening 48 as shown in FIG. 1O. In this manner, portions of the surface defining the fusible link 40 and the bonding pad areas 42 are exposed. Thus, unlike prior art fusible links, the fusible links do not contain a thin oxide layer to define the rupturable portion of the fusible link. Rather, the fusible link surface is exposed, i.e., naked. Alternatively, the passivation layer can be patterned with photosensitive polyimides generally referred to by those in the art as PSPI. The fuse area opening 48 defines the rupture zone for the fusible link 40. That is, upon opening the fusible link, the rupture zone the debris and matter generated is contained within the opening 48.

The fusible links can be opened using conventional laser processing. One advantage is that the aforementioned process permits laser fuse blow without cracking of the underlying oxide layer. Thus, the copper metal layers are embedded in the low k dielectric and exposure to the atmosphere is prevented.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A process for forming a fusible link in an integrated circuit comprising:

forming a second dielectric layer on a planarized surface of an underlying metal interconnect and first dielectric layer, wherein the first and the second dielectric layers have a dielectric constant less than about 3.0, and wherein the underlying metal interconnect comprises copper;

depositing an oxide layer at a thickness effective to prevent cracking of the oxide layer during a laser fuse process;

forming a via in the oxide layer and second dielectric layer extending to the underlying metal interconnect;

filling the via with a conductive metal;

forming a final metal layer;

patterning the final metal layer to form a fusible link, a bonding pad area and wiring;

depositing a passivation layer, and patterning the passivation layer to simultaneously remove the passivation layer from the bonding pad area and a portion of the fusible link, wherein surfaces of the fusible link and the bonding pad area are exposed.

2. The process according to claim 1, wherein the final metal layer comprises an aluminum metal.

3. The process according to claim 1 wherein the via metal and the final metal layer comprise an aluminum metal.

4. The process according to claim 1, wherein the first dielectric layer comprises a layer of SILK®.

5. The process according to claim 1 further comprising depositing a barrier layer in the via prior to filling the via with the metal.

* * * * *